(12) United States Patent
Khusnatdinov (10) Patent No.: US 10,303,049 B2
(45) Date of Patent: May 28, 2019

(54) REDUCING ELECTRIC CHARGE IN IMPRINT LITHOGRAPHY

(71) Applicant: Canon Kabushiki Kaisha, Tokyo (JP)

(72) Inventor: Niyaz Khusnatdinov, Round Rock, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 118 days.

(21) Appl. No.: 15/466,203

(22) Filed: Mar. 22, 2017

(65) Prior Publication Data
US 2018/0275509 A1 Sep. 27, 2018

(51) Int. Cl.
*G03F 7/00* (2006.01)

(52) U.S. Cl.
CPC ................. *G03F 7/0002* (2013.01)

(58) Field of Classification Search
CPC ................................................. G03F 7/0002
See application file for complete search history.

(56) References Cited

U.S. PATENT DOCUMENTS

| 5,272,979 A * | 12/1993 | Lewis ................... B41C 1/1033 101/467 |
|---|---|---|
| 6,873,087 B1 | 3/2005 | Choi |
| 6,932,934 B2 | 8/2005 | Choi |
| 7,157,036 B2 | 1/2007 | Choi |
| 8,226,392 B2 | 7/2012 | Kawakami |
| 2004/0124566 A1 | 7/2004 | Sreenivasan |
| 2004/0188381 A1 | 9/2004 | Sreenivasan |
| 2004/0211754 A1 | 10/2004 | Sreenivasan |
| 2005/0134828 A1 * | 6/2005 | Ottens ...................... G03F 7/707 355/75 |
| 2005/0187339 A1 | 8/2005 | Xu |
| 2009/0267267 A1 * | 10/2009 | Yoneda ................ B29C 37/0053 264/293 |
| 2010/0084376 A1 * | 4/2010 | Khusnatdinov ........ B82Y 10/00 216/39 |
| 2010/0104852 A1 * | 4/2010 | Fletcher ................. B82Y 10/00 428/315.5 |
| 2011/0018167 A1 * | 1/2011 | Koole .................... B82Y 10/00 264/293 |

(Continued)

OTHER PUBLICATIONS

H. H. Wittenberg. Gas Tube Design, Electron Tube Design, RCA Electron Tube Division, 1962, pp. 792-817.

*Primary Examiner* — Liam J Heincer
(74) *Attorney, Agent, or Firm* — Fish & Richardson P.C.

(57) ABSTRACT

Methods and systems for contacting a polymerizable material on a surface of a substrate with a patterning surface of a template; curing the polymerizable material in a working environment, comprising a first gas, the working environment proximate to the surface of the substrate; after introducing a second gas into the working environment, separating the patterning surface of the template and the surface of the substrate to achieve at least a particular distance between the patterning surface and the surface of the substrate; and after achieving the particular distance, introducing a third gas into the working environment, wherein, for a given pressure of the working environment, the second gas has a breakdown voltage less than that of the first gas up to the particular distance, and the third gas has a breakdown voltage less than that of the second gas at distances greater than the particular distance.

12 Claims, 9 Drawing Sheets

(56) References Cited

U.S. PATENT DOCUMENTS

| | | | |
|---|---|---|---|
| 2011/0186544 A1* | 8/2011 | Endou | B29C 71/02 216/58 |
| 2013/0182236 A1* | 7/2013 | De Schiffart | B29C 43/021 355/74 |
| 2014/0312532 A1* | 10/2014 | Mizuno | B29C 43/203 264/299 |
| 2014/0314897 A1* | 10/2014 | Ahn | G03F 7/0002 425/385 |
| 2017/0120572 A1 | 5/2017 | Khusnatdinov | |

* cited by examiner

REDUCING ELECTRIC CHARGE IN IMPRINT LITHOGRAPHY

BACKGROUND

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed.

SUMMARY

Innovative aspects of the subject matter described in this specification may be embodied in a method of disposing a polymerizable material on a surface of a substrate; contacting the polymerizable material with a patterning surface of an imprint lithography template; curing the polymerizable material in a working environment, comprising a first gas, to yield a cured polymeric layer, the working environment proximate to the surface of the substrate; introducing a second gas into the working environment; after introducing the second gas into the working environment, separating the patterning surface of the imprint lithography template and the surface of the substrate to achieve at least a particular distance between the patterning surface of the imprint lithography template and the surface of the substrate; and after achieving at least the particular distance between the patterning surface of the imprint lithography template and the surface of the substrate, introducing a third gas into the working environment, wherein, for a given pressure of the working environment, the second gas has a breakdown voltage less than that of the first gas up to the particular distance, and the third gas has a breakdown voltage less than that of the second gas at distances greater than the particular distance.

Other embodiments of these aspects include corresponding systems configured to perform the actions of the methods.

These and other embodiments may each optionally include one or more of the following features. For instance, introducing the second gas into the working environment includes displacing the first gas from the working environment. Introducing the third gas into the working environment includes displacing at least the second gas from the working environment. The first gas and the third gas includes helium and the second gas includes air. The first gas includes helium, the second gas includes air, and the third gas includes neon and argon. After introducing the third gas into the working environment, introducing a fourth gas into the working environment, wherein, for the given pressure of the working environment, the fourth gas has a breakdown voltage less than that of the third gas at subsequent distances between the patterning surface of the imprint lithography template and the surface of the substrate, the subsequent distances greater than the particular distance. Introducing the fourth gas into the working environment comprises displacing at least the third gas from the working environment. The first gas and the third gas includes helium, the second gas includes air, and the fourth gas includes neon and argon.

Innovative aspects of the subject matter described in this specification may be embodied in a system including a template chuck configured to hold an imprint lithography template; a substrate chuck configured to hold a substrate, a surface of the substrate having a polymerizable material positioned thereon; an energy source configured to provide energy to cure the polymerizable material; an imprint head coupled to the template chuck and configured to adjust a distance between a patterning surface of the imprint lithography template and the surface of the substrate; a gas supply module configured to introduce gas into a working environment proximate to the surface of the substrate; a processor in communication with the gas supply module, the processor configured to: i) provide a first signal to the gas supply module such that the gas supply module introduces a first gas into the working environment when the energy source is providing the energy to cure the polymerizable material, ii) provide a second signal to the gas supply module such that the gas supply module introduces a second gas into the working environment after the energy source provides the energy to cure the polymerizable material, and iii) provide a third signal to the gas supply module such that the gas supply module introduces a third gas into the working environment after at least a particular distance between the patterning surface of the imprint lithography template and the surface of the substrate is achieved, wherein, for a given pressure of the working environment, the second gas has a breakdown voltage less than that of the first gas up to the particular distance, and the third gas has a breakdown voltage less than the second gas at distances greater than the particular distance.

Other embodiments of these aspects include corresponding method configured to perform the actions of the system.

These and other embodiments may each optionally include one or more of the following features. For instance, the processor is configured to provide the second signal to the gas supply module such that introducing the second gas into the working environment includes displacing the first gas from the working environment. The processor is configured to provide the third signal to the gas supply module such that introducing the third gas into the working environment includes displacing at least the second gas from the working environment. The first gas and the third gas include helium and the second gas includes air. The first gas includes helium, the second gas includes air, and the third gas includes neon and argon. The processor is configured to provide a fourth signal to the gas supply module such that the gas supply module introduces a fourth gas into the working environment, the fourth gas having a breakdown voltage less than that of the third gas at subsequent distances between the patterning surface of the imprint lithography template and the surface of the substrate, the subsequent distances greater than the particular distance. The processor is configured to provide the fourth signal to the gas supply module such that introducing the fourth gas into the working environment includes displacing at least the third gas from the working environment. The first gas and the third gas comprise helium, the second gas comprises air, and the fourth gas includes neon and argon.

Particular implementations of the subject matter described in this specification can be implemented so as to realize one or more of the following advantages. For instance, electric charge between a template and a substrate is reduced (during and after separation of the template and the substrate). Another advantage includes reduction in particle formation on the template, the substrate, or both. A further advantage includes prevention of template damage by particle formation.

The details of one or more embodiments of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
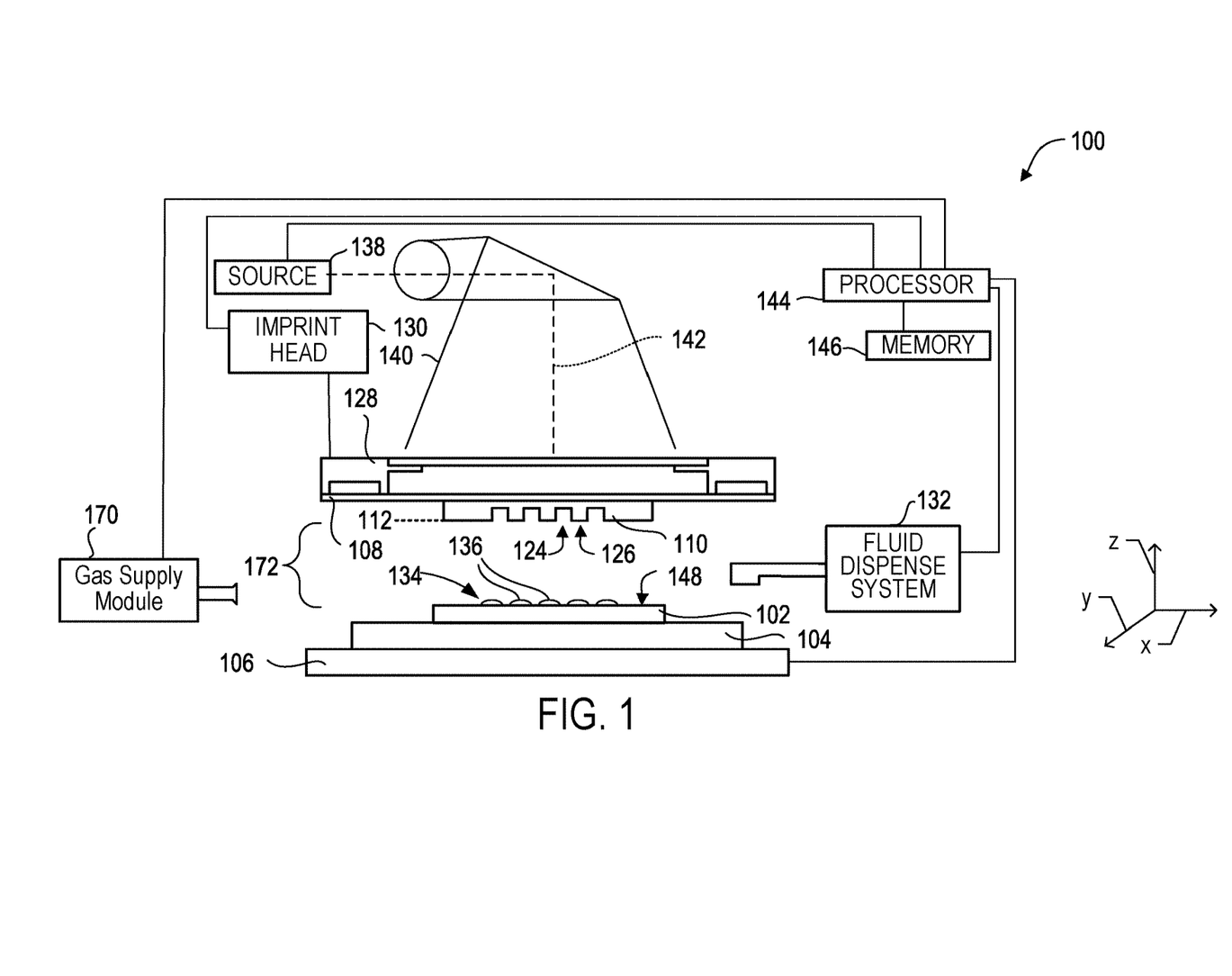
FIG. 1 illustrates a simplified side view of a lithographic system.

FIG. 1 illustrates an imprint lithography system 100 that forms a relief pattern on a substrate 102. The substrate 102 may be coupled to a substrate chuck 104. The substrate chuck 104 is configured to hold the substrate 102. In some examples, the substrate chuck 104 can include a vacuum chuck, a pin-type chuck, a groove-type chuck, an electromagnetic chuck, and the like. Exemplary chucks are described in U.S. Pat. No. 6,873,087, which is hereby incorporated by reference herein. The substrate 102 and the substrate chuck 104 may be further supported by a stage 106. The stage 106 provides motion about the x- and y-axes, and rotation about the z-axis. The stage 106, the substrate 102, and the substrate chuck 104 may also be positioned on a base (not shown).

The imprint lithography system 100 further includes an imprint lithography template 108 that is spaced apart from the substrate 102. In some examples, the template 108 includes a mesa 110 (mold 110) that extends from the template 108 towards the substrate 102. In some examples, the template 108 includes a patterning surface 112. The template 108 and the mold 110 may be formed from such materials including, but not limited to, fused-silica, quartz, silicon, organic polymers, siloxane polymers, borosilicate glass, fluorocarbon polymers, metal, hardened sapphire, and the like. In the illustrated example, the patterning surface 112 includes a plurality of features defined by spaced-apart recesses 124 and protrusions 126. However, in some examples, other configurations of features are possible. The patterning surface 112 may define any original pattern that forms the basis of a pattern to be formed on substrate 102.

The template 108 may be coupled to a template chuck 128. The template chuck 128 is configured to hold the template 108. In some examples, the template chuck 128 can include a vacuum chuck, a pin-type chuck, a groove-type chuck, an electromagnetic chuck, and the like. Exemplary chucks are described in U.S. Pat. No. 6,873,087. Further, the template chuck 128 may be coupled to an imprint head 130 such that the template chuck 128, the imprint head 130, or both, may be configured to facilitate movement of the template 108. The imprint head 130 is configured to adjust a distance between the patterning surface 112 and a surface 148 of the substrate 102.

The imprint lithography system 100 may further include a fluid dispense system 132. The fluid dispense system 132 may be used to deposit a polymerizable material 134 on the surface 148 of the substrate 102. The polymerizable material 134 may be positioned upon the substrate 102 using techniques such as drop dispense, spin-coating, dip coating, chemical vapor deposition (CVD), physical vapor deposition (PVD), thin film deposition, thick film deposition, and the like. In some examples, the polymerizable material 134 is positioned upon the substrate 102 before a desired volume is defined between the template 108 and the substrate 102. In some examples, the polymerizable material 134 is positioned upon the substrate 102 after the desired volume is defined between the template 108 and the substrate 102. The polymerizable material 134 may include a monomer as described in U.S. Pat. No. 7,157,036 and U.S. Patent Application Publication No. 2005/0187339, all of which are hereby incorporated by reference herein. In some examples, the polymerizable material 134 is positioned upon the substrate 102 as a plurality of droplets 136.

Figure 2:
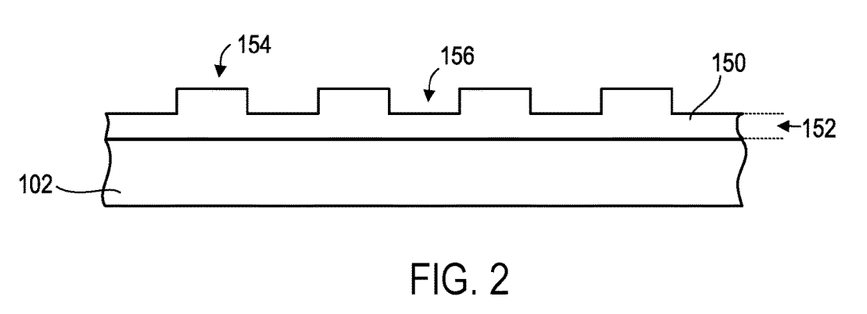
FIG. 2 illustrates a simplified side view of the substrate shown in FIG. 1 having a patterned layer positioned thereon.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a processor 144 in communication with the stage 106, the imprint head 130, the fluid dispense system 132, and the energy source 138, and may operate on a computer readable program stored in a memory 146.

The imprint lithography system 100 further includes a gas supply module 170. The gas supply module 170 is configured to introduce gas into a working environment 172 proximate to the surface 148 of the substrate 102. In some examples, the working environment 172 is the space defined between the patterning surface 112 of the template 108 and the surface 148 of the substrate 102. The working environment 172 can include the environment surrounding and proximate the surface 148 of the substrate 102, and in particular, include the environment surrounding and proximate the polymerizable material 134.

In some examples, the imprint head 130, the stage 106, or both, vary a distance between the template 108 and the substrate 102 to define a desired volume therebetween that is filled by the polymerizable material 134. For example, the imprint head 130 may apply a force to the template 108 such that the template 108 contacts the polymerizable material 134. After the desired volume is filled by the polymerizable material 134, the energy source 138 produces energy 140, e.g., broadband ultraviolet radiation, causing the polymerizable material 134 to solidify, cross-link, or both, conforming to shape of a surface 148 of the substrate 102 and the patterning surface 112, defining a patterned layer 150 on the substrate 102 after separation between the template 108 and the substrate 102. In some examples, the patterned layer 150 (or polymeric layer 150) may include a residual layer 152 and a plurality of features shown as protrusions 154 and recessions 156, with the protrusions 154 having a thickness $t_1$ and the residual layer 152 having a thickness $t_2$.

The processor 144 can further be in communication with the gas supply module 170. The processor 144 can provide signals to the gas supply module 170 such that the gas supply module 170 introduces different gases into the working environment 172 at different stages of the imprint process, described further herein.

The herein-described system and process may be further implemented in imprint lithography processes and systems, such as those referred to in U.S. Pat. No. 6,932,934, U.S. Patent Application Publication No. 2004/0124566, U.S. Patent Application Publication No. 2004/0188381, and U.S. Patent Application Publication No. 2004/0211754, each of which is hereby incorporated by reference herein.

During contact between the template 108 and the polymerizable material 134, an electric charge can form at the contact interface of the template 108 and the polymerizable material 134. During separation of the template 108 and the substrate 102, at least a portion of this electric charge can remain on (e.g., associated with) the template 108, the polymerizable material 134, the substrate 102, or any combination thereof, resulting in an electric voltage up to 25 kV. Such electric charge can result in the formation of particle defects on the template 108, the substrate 102, or both, and further affect the quality of subsequently processed imprint fields (e.g., non-fill defects, residual layer thickness variations). For example, high electric field associated with the charge of the template 108 (e.g., $10^6$ V/cm) can attract charged or polarized particles to the template surface. In some cases, the particle defects can result in permanent template damage.

The electric voltage between the template 108 and the substrate 102 (e.g., the breakdown voltage) can be a function of, for a given gas, at least a) a pressure of the gas in the working environment 172 and b) a distance between the template 108 and the substrate 102. In one example, the electric voltage between the template 108 and the substrate 102 can be a function of, for a given gas, a product of the pressure of the gas in the working environment 172 and the distance between the template 108 and the substrate 102. In some examples, the pressure of the gas in the working environment 172 is substantially constant (e.g., 760 mm Hg).

Discharge of the electric voltage between the template 108 and the substrate 102 can follow a Paschen gas discharge curve for the given gas. The Paschen gas discharge curve, for a given gas, provides a breakdown voltage of the gas as a function of the distance between the template 108 and the substrate 102 for a constant pressure. Utilizing the Paschen gas discharge curve associated with the given gas, and for a pressure of the given gas in the working environment 172, as the distance between the template 108 and the substrate 102 changes (e.g., during separation), the electric potential between the template 108 and the substrate 102 can be determined. To reduce (or minimize) the electric charge and related electric voltage (e.g., breakdown voltage) between the template 108 and the substrate 102 during (and after) separation between the template 108 and the substrate 102, the gas composition within the working environment 172 is selectively adjusted at different distances between the template 108 and the substrate 102 based on the associated Paschen gas discharge curves for each gas composition.

Figure 3:
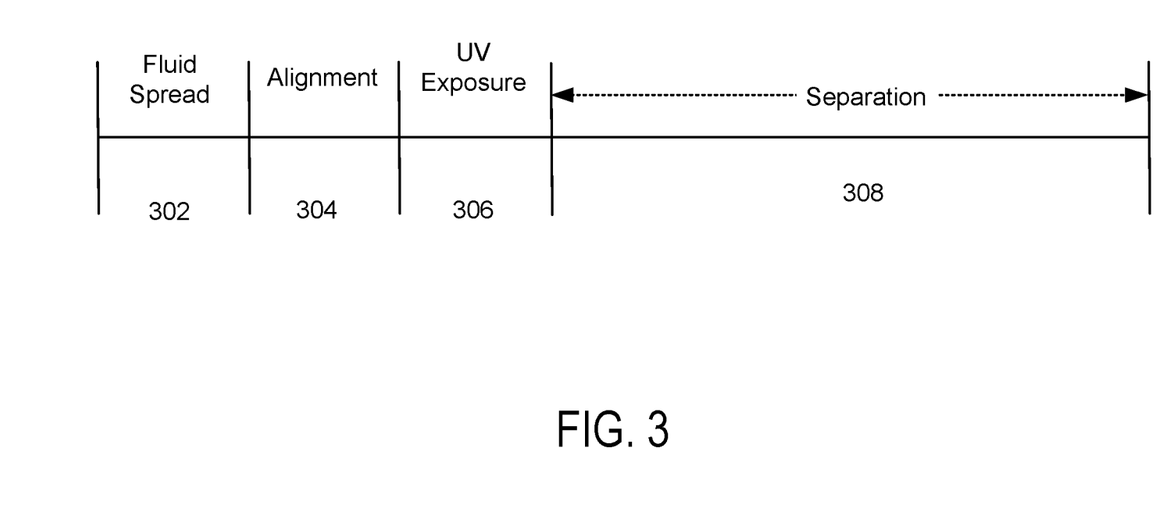
FIG. 3 is a timeline of process stages associated with system of FIG. 1 and introduction of gases within an atmosphere.

FIG. 3 illustrates a timeline 300 of process stages associated with system 100 and introduction of gases within the working environment 172. A stage 302 is associated with a spreading of the polymerizable material 134 on the surface 148 of the substrate 102. Stage 304 is associated with alignment of the template 108 and the substrate 102. Stage 306 is associated with ultraviolet light exposure of the polymerizable material 134. Stage 308 is associated with separation between the template 108 and the substrate 102 after exposure of the ultraviolet light to the polymerizable material 134.

During stage 302, that is, during contact between the polymerizable material 134 on the surface 148 of the substrate 102 with the patterning surface 112, the working environment 172 includes a first gas. The processor 144 provides a first signal to the gas supply module 170 such that the gas supply module 170 introduces the first gas into the working environment 172 during stage 302 (e.g., spreading of the polymerizable material 134). In some examples, the first gas includes helium. In some examples, the first gas can include up to 100% helium.

During stages 304 and 306, the working environment 172 includes the first gas. That is, the gas composition of the working environment 172 is maintained through stages 304 and 306, that is, during alignment of the template 108 and the substrate 102 and ultraviolet light exposure of the polymerizable material 134. In some examples, the working environment 172 includes helium during stage 302 (fluid spreading), stage 304 (alignment), and stage 306 (curing). However, in some examples, during stage 302, the working environment 172 includes helium and during stages 304 and 306, the working environment 172 can include air.

In some examples, the processor 144 provides the first signal to the gas supply module 170 such that the gas supply module 170 introduces the first gas into the working environment 172 during stage 306, that is, when the energy source 138 produces the energy 140 to cure the polymerizable material 134 on the surface 148 of the substrate 102 to yield the polymeric layer 150. In some examples, the processor 144 provides the first signal to the gas supply module 170 such that the gas supply module 170 introduces the first gas into the working environment 172 prior to separation between the template 108 and the substrate 102.

Figure 4A:
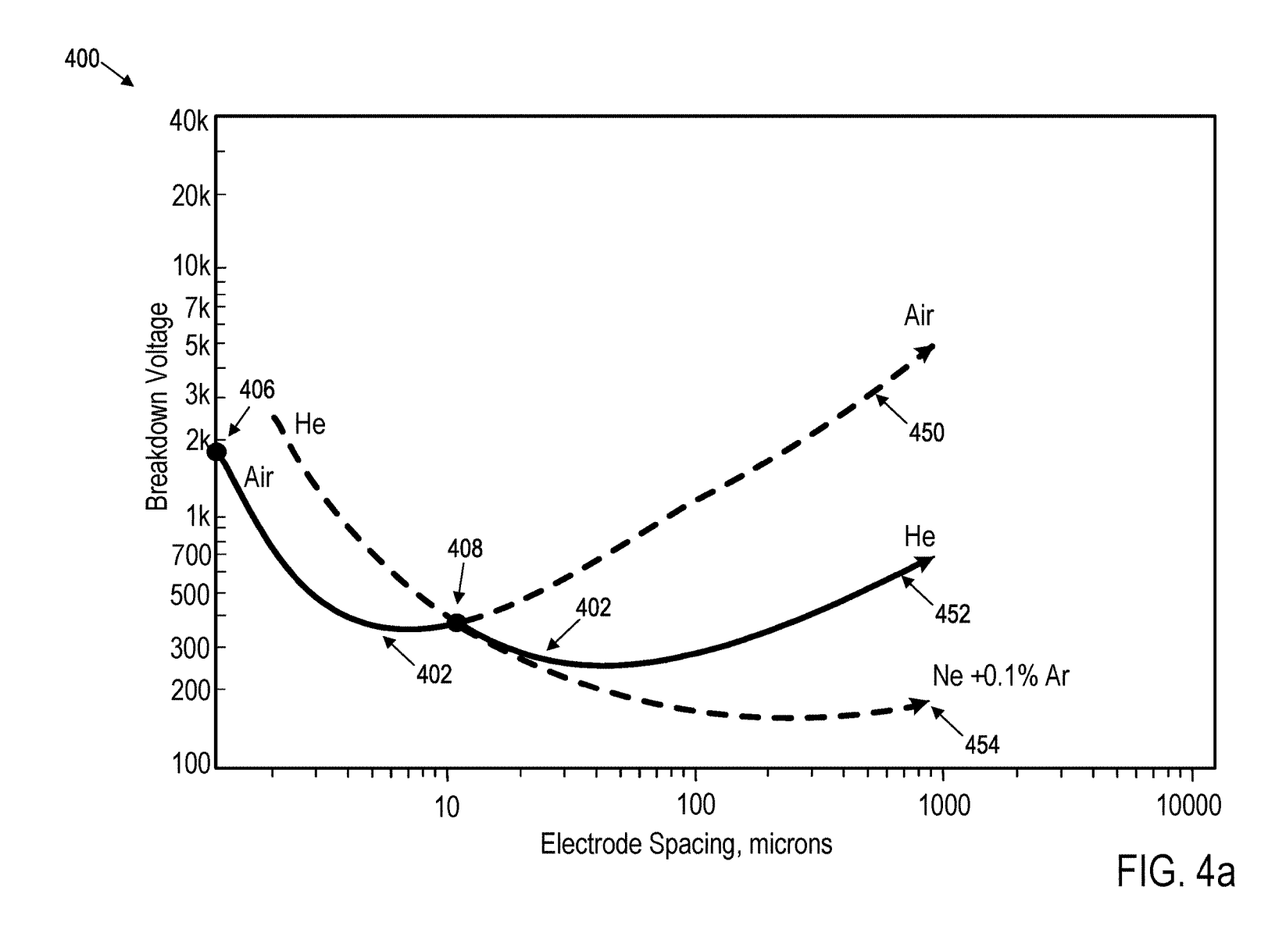
FIGS. 4a-4e illustrate Paschen curves of multiple gases in the atmosphere.

Referring to FIG. 4a, Paschen curves of multiple gases are shown. In particular, a path 402 is shown that is a function of a breakdown voltage for given distances between the template 108 and the substrate 102 and a constant pressure of the gas within the working environment 172. The path 402 shows one example of differing gas compositions within the working environment 172 as the distance between the template 108 and the substrate 102 is increased (e.g., during separation). The working environment 172 includes the first gas until initiation of separation between the patterning surface 112 of the template 108 and the surface 148 of the substrate 102, shown as point 406.

During stage 308, the working environment 172 includes a second gas. The processor 144 provides a second signal to the gas supply module 170 such that the gas supply module 170 introduces the second gas into the working environment 172 during stage 308, and in particular, after the energy source 138 provides the energy 140 to cure the polymerizable material 134 and further during initiation of the separation between the template 108 and the substrate 102. In some examples, the second gas includes air. In some examples, introducing the second gas into the working environment 172 includes displacing the first gas from the working environment 172 (e.g., by the second gas).

Referring to FIG. 4a, the point 406 of the path 402 is associated with the initiation of the separation between the template 108 and the substrate 102 and further, the point 406 is associated with the introduction of the second gas by the gas supply module 170 into the working environment 172. The working environment 172 includes the second gas until a point 408 is reached that is associated with a first distance between the patterning surface 112 of the template 108 and the surface 148 of the substrate 102.

The point 408 is associated with the first distance at which, for distances less than the first distance and the given pressure of the working environment 172, the second gas is associated with a breakdown voltage less than that of the first gas. As shown by the path 402, for the distances between the patterning surface 112 of the template 108 and the surface 148 of the substrate 102 from the point 406 (initiation of separation between the template 108 and the substrate 102) to the point 408 that is associated with the first distance, the breakdown voltages associated with the second gas is less than the breakdown voltages associated with the first gas. For example, the Paschen curve 450 of air for distances between the patterning surface 112 of the template 108 and the surface 148 of the substrate 102 between point 406 and point 408 is associated with breakdown voltages less than the breakdown voltages associated with the Paschen curve 452 for helium for the same distances between the patterning surface 112 of the template 108 and the surface 148 of the substrate 102 between points 406 and 408.

In some examples, the second gas is introduced prior to separation of the template 108 and the substrate 102. Thus, the initiation of the separation of the template 108 and the substrate 102 occurs in the working environment 172 including the second gas.

In some examples, during the stage 308, the working environment 172 includes a third gas. The processor 144 provides a third signal to the gas supply module 170 such that the gas supply module 170 introduces the third gas into the working environment 172 during stage 308, and in particular, after the first distance between the patterning surface 112 of the template 108 and the surface 148 of the substrate 102 is achieved. In some examples, the third gas includes helium. In some examples, the third gas can include up to 100% helium. In some examples, introducing the third gas into the working environment 172 includes displacing the second gas from the working environment 172 (e.g., by the third gas).

Referring to FIG. 4a, the point 408 of the path 402 is associated with the first distance between the template 108 and the substrate 102, and further, the point 408 of the path 402 is associated the introduction of the third gas by the gas supply module 170 into the working environment 172. For distances greater than the first distance and the given pressure of the working environment 172, the third gas is associated with breakdown voltages less than that of the second gas. As shown by the path 402, for distances between the patterning surface 112 of the template 108 and the surface 148 of the substrate 102 greater than the first distance associated with the point 408, the breakdown voltages associated with the third gas are less than the breakdown voltages associated with the second gas. For example, the Paschen curve 452 for helium for distances between the patterning surface 112 of the template 108 and the surface 148 of the substrate 102 greater that the first distance of point 408 is associated with breakdown voltages less than the breakdown voltages associated with the Paschen curve 450 for air for the same distances between the patterning surface 112 of the template 108 and the surface 148 of the substrate 102.

In some implementations, during stage 308, the working environment 172 includes a fourth gas. The processor 144 provides a fourth signal to the gas supply module 170 such that the gas supply module 170 introduces the fourth gas into the working environment 172 during stage 308, and in particular, after a second distance between the patterning surface 112 of the template 108 and the surface 148 of the substrate 102 is achieved (the second distance greater than the first distance). In some examples, the fourth gas includes a combination of neon and argon. In some examples, the fourth gas can include up to 100% neon and argon combination. In some examples, introducing the fourth gas into the working environment 172 includes displacing the third gas from the working environment 172 (e.g., by the fourth gas).

Figure 4B:
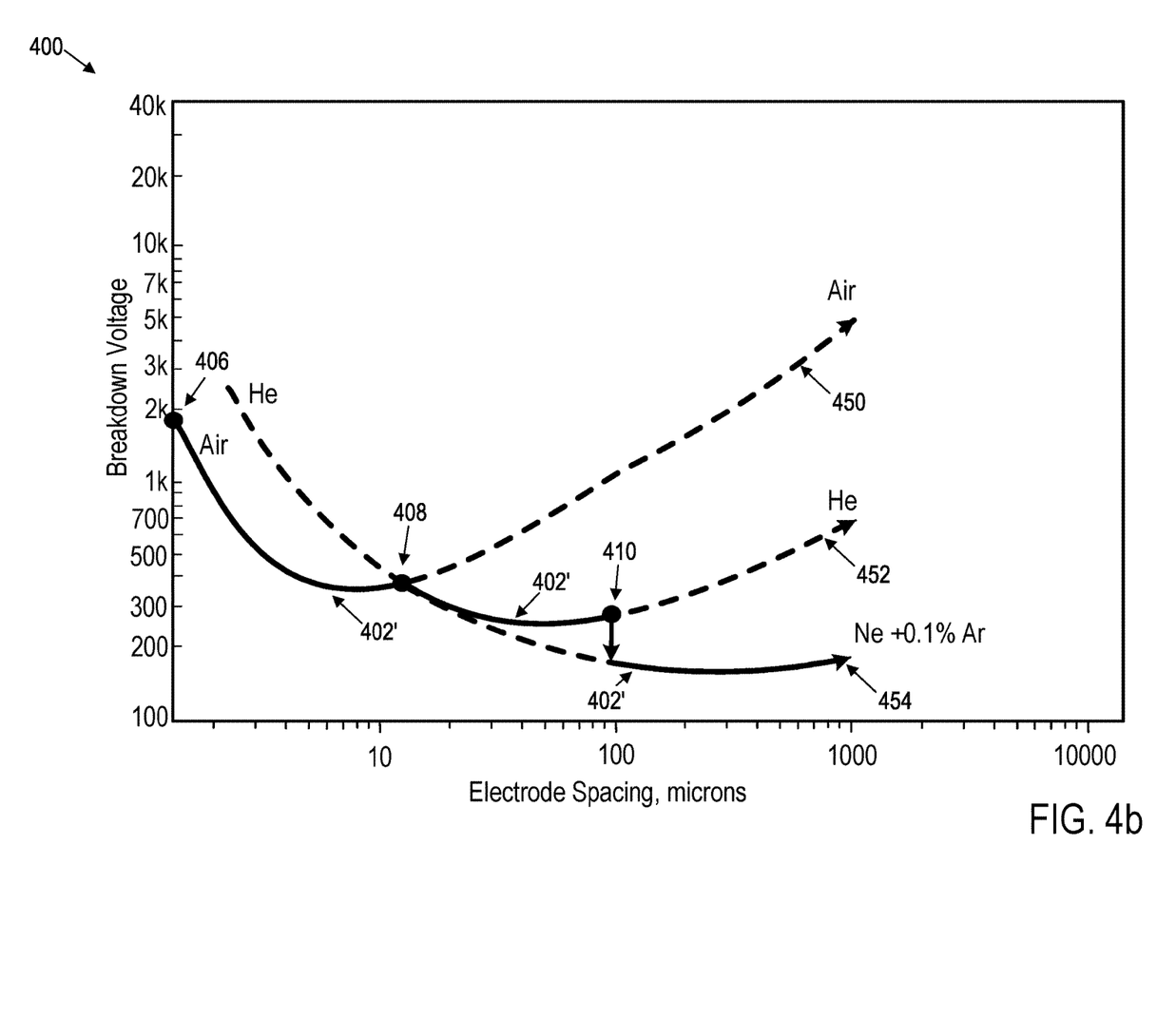

Referring to FIG. 4b, a point 410 of the path 402' is associated with the second distance between the template 108 and the substrate 102, and further, the point 410 of the path 402' is associated with the introduction of the fourth gas by the gas supply module 170 into the working environment 172. For distances greater than the second distance and the given pressure of the working environment 172, the fourth gas is associated with breakdown voltages less than that of the third gas. As shown by the path 402', for distances between the patterning surface 112 of the template 108 and the surface 148 of the substrate 102 greater than the second distance associated with the point 410, the breakdown voltages associated with the fourth gas (is less than the breakdown voltages associated with the third gas. For example, the Paschen curve 454 for the combination of neon and argon for distances between the patterning surface 112 of the template and the surface 148 of the substrate 102 greater that the subsequent distance of point 410 is associated with breakdown voltages less than the breakdown voltages associated with the Paschen curve 452 for helium for the same distances between the patterning surface 112 of the template and the surface 148 of the substrate 102.

Figure 4C:
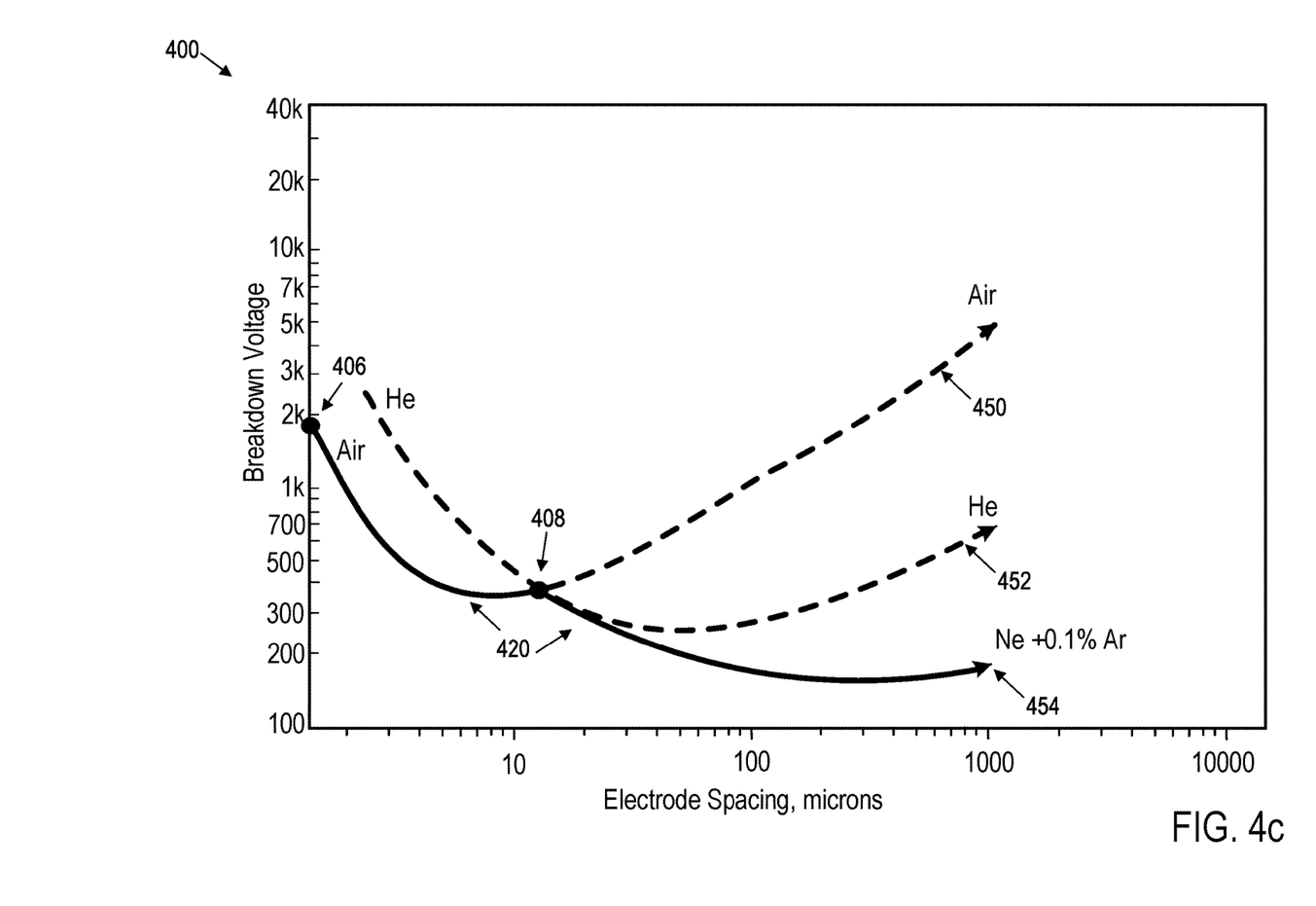

In some implementations, the third gas includes a combination of neon and argon. In some examples, the third gas can include up to 100% neon and argon combination. Referring to FIG. 4c, for distances greater than the first distance and the given pressure of the working environment 172, the third gas is associated with breakdown voltages less than that of the second gas. As shown by the path 420, for distances between the patterning surface 112 of the template 108 and the surface 148 of the substrate 102 greater than the first distance associated with the point 408, the breakdown voltages associated with the third gas is less than the breakdown voltages associated with the second gas. For example, the Paschen curve 454 for the combination of neon and argon for distances between the patterning surface 112 of the template 108 and the surface 148 of the substrate 102 greater that the first distance of point 408 is associated with breakdown voltages less than the breakdown voltages associated with the Paschen curve 450 for air for the same distances between the patterning surface 112 of the template 108 and the surface 148 of the substrate 102.

In some further implementations, the second gas is maintained in the working environment 172 after introduction of such (i.e., after the energy source 138 provides the energy 140 to cure the polymerizable material 134 and further during initiation of the separation between the template 108 and the substrate 102). For example, the second gas is maintained in the working environment 172 until, as the distance between the patterning surface 112 of the template 108 and the surface 148 of the substrate 102 is increased, a breakdown voltage associated with the second gas at the increased distance approaches the breakdown voltage associated with the initiation of the separation between the template 108 and the substrate 102.

Figure 4D:
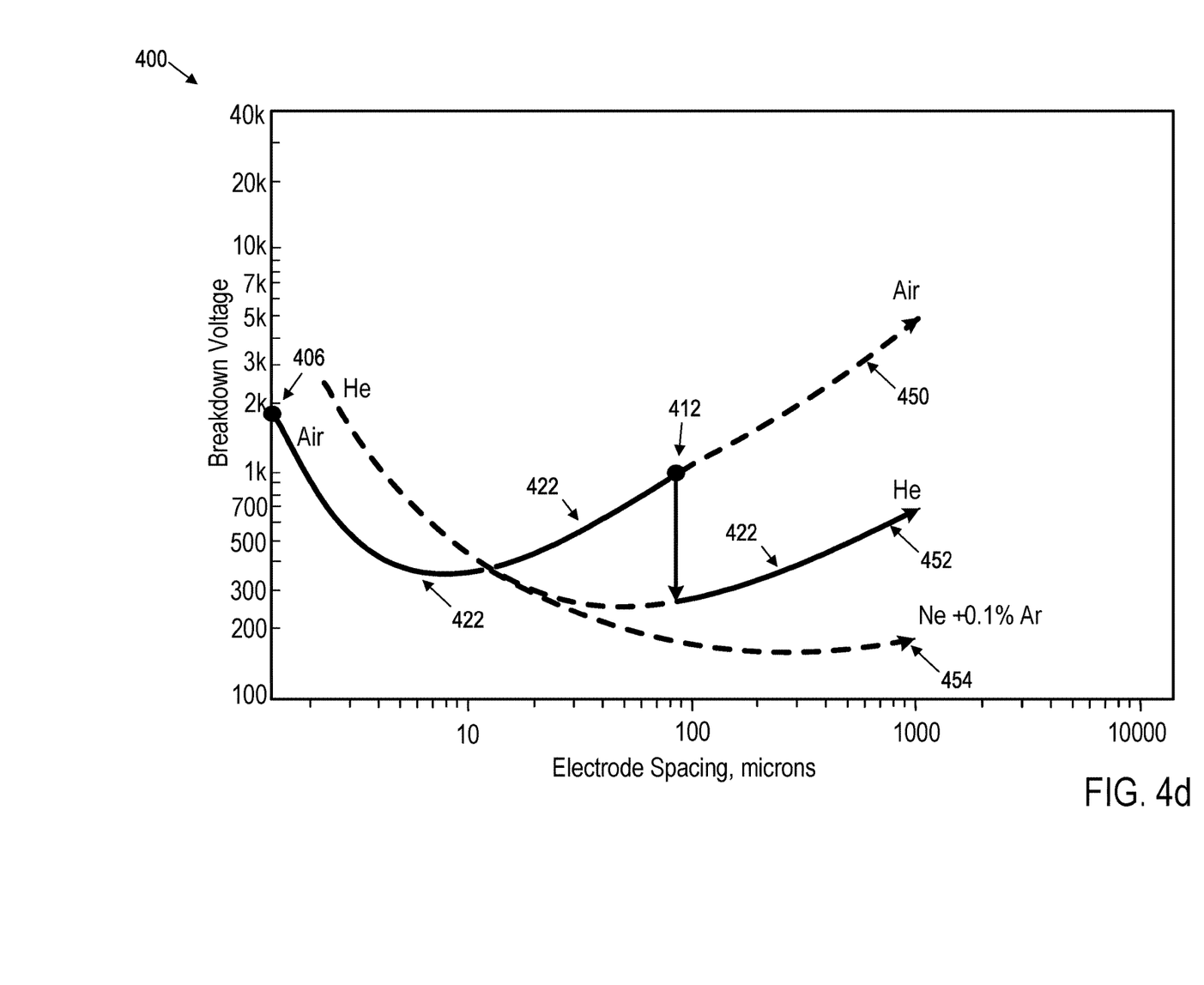

For example, referring to FIG. 4d, a point 412 of a path 422 is associated with a third distance between the patterning surface 112 of the template 108 and the surface 148 of the substrate 102, and further, where the breakdown voltage associated with the point 412 for the second gas for the given pressure of the working environment 172 is less than the breakdown voltage associated with the point 406 for the second gas for the given pressure of the working environment 172. For distances greater than the third distance and the given pressure of the working environment 172, the processor 144 provides a fifth signal to the gas supply module 170 such that the gas supply module 170 introduces a fifth gas into the working environment 172. In some examples, introducing the fifth gas into the working environment 172 includes displacing the second gas from the working environment 172 (e.g., by the fifth gas).

In some examples, the fifth gas includes helium. In some examples, the fifth gas can include up to 100% helium. As shown by the path 422, for distances between the patterning surface 112 of the template 108 and the surface 148 of the substrate 102 greater than the third distance associated with the point 412, the breakdown voltages associated with the fifth gas is less than the breakdown voltages associated with the second gas. For example, the Paschen curve 452 for helium for distances between the patterning surface 112 of the template 108 and the surface 148 of the substrate 102 greater that the third distance of point 412 is associated with breakdown voltages less than the breakdown voltages associated with the Paschen curve 450 for air for the same distances between the patterning surface 112 of the template 108 and the surface 148 of the substrate 102.

Figure 4E:
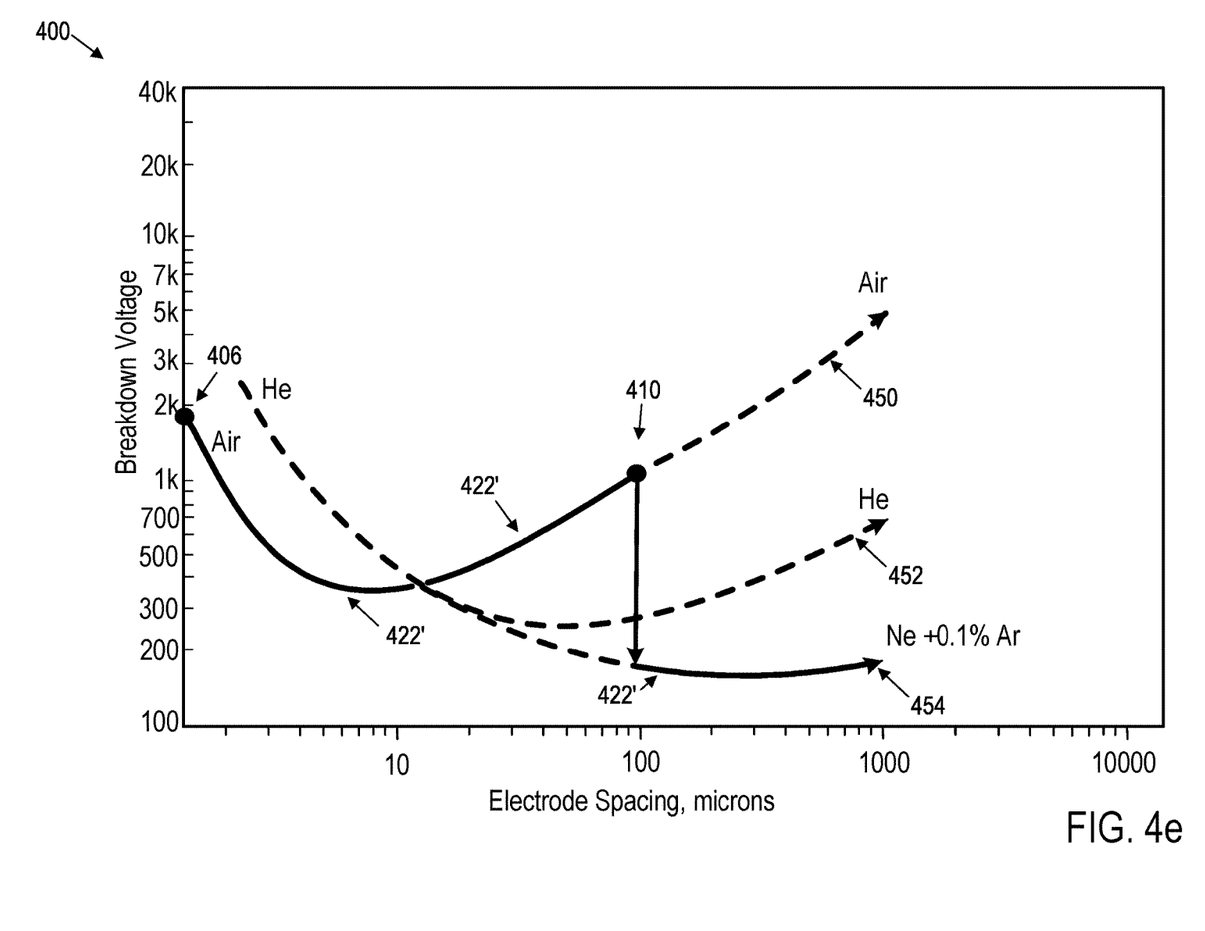

In some examples, the fifth gas includes a combination of neon and argon. In some examples, the fifth gas can include up to 100% neon and argon combination. Referring to FIG. 4e, as shown by a path 422', for distances between the patterning surface 112 of the template 108 and the surface 148 of the substrate 102 greater than the third distance associated with the point 412, the breakdown voltages associated with the fifth gas is less than the breakdown voltages associated with the second gas. For example, the Paschen curve 454 for the combination of neon and argon for distances between the patterning surface 112 of the template 108 and the surface 148 of the substrate 102 greater that the third distance of point 412 is associated with breakdown voltages less than the breakdown voltages associated with the Paschen curve 450 for air for the same distances between the patterning surface 112 of the template 108 and the surface 148 of the substrate 102.

Figure 5:
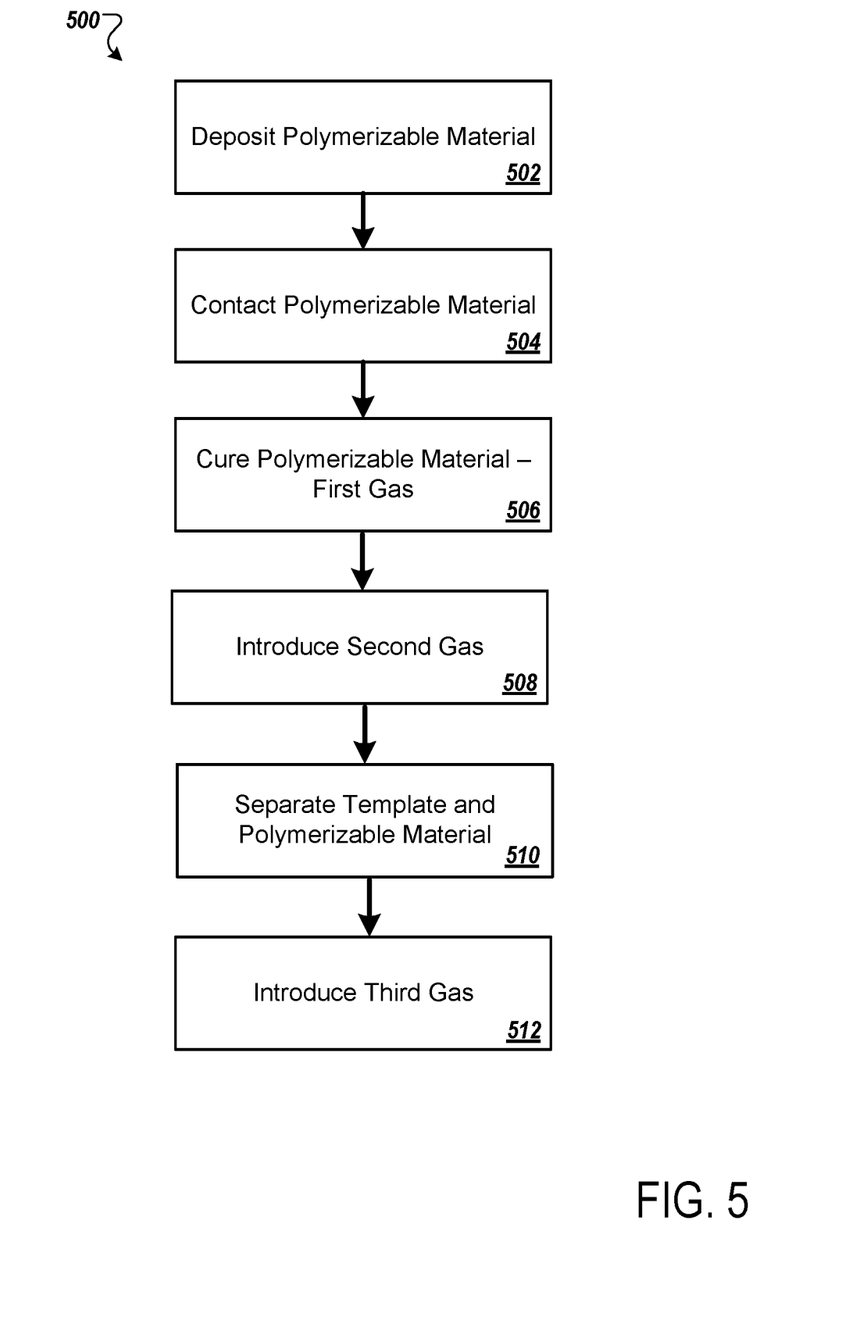
FIG. 5 is a flow chart of an example method of introducing gases within the atmosphere.

FIG. 5 illustrates an example method for introducing gases within the atmosphere. The process 500 is illustrated as a collection of referenced acts arranged in a logical flow graph. The order in which the acts are described is not intended to be construed as a limitation, and any number of the described acts can be combined in another order or in parallel to implement the process.

A polymerizable material is disposed on a surface of a substrate (502). For example, the fluid dispense system 132 deposits the polymerizable material 134 on the surface 148 of the substrate 102. The polymerizable material is contacted with a patterning surface of an imprint lithography template (504). For example, the imprint head 130 applies a force to the template 108 such that the patterning surface 112 of the template 108 contacts the polymerizable material 134. The polymerizable material is cured in an atmosphere, including a first gas, to yield a cured polymeric layer The atmosphere is proximate to the surface of the substrate (506). For example, the gas supply module 170 introduces the first gas into the working environment 172 when the energy source 138 produces the energy 140 to cure the polymerizable material 134 on the surface 148 of the substrate 102 to yield the polymeric layer 150. A second gas is introduced into the atmosphere (508). For example, the gas supply module 170 introduces the second gas into the working environment 172 after the energy source 138 provides the energy 140 to cure the polymerizable material 134. Further, for example, the gas supply module 170 introduces the second gas into the working environment 172 during initiation of the separation between the template 108 and the substrate 102.

After introducing the second gas into the atmosphere, the patterning surface of the imprint lithography template and the cured polymeric layer are separated to achieve at least a particular distance between the patterning surface of the imprint lithography template and the surface of the substrate (510). For example, the imprint head 130 applies a force to the template 108 to separate the patterning surface 112 of the template 108 and the surface 148 of the substrate 102. After achieving at least the particular distance between the patterning surface of the imprint lithography template and the surface of the substrate, a third gas is introduced into the atmosphere (512). For example, the gas supply module 170 introduces the third gas into the working environment 172 after the first distance between the patterning surface 112 of the template 108 and the surface 148 of the substrate 102 is achieved.

In some examples, for a given pressure of the atmosphere, the second gas has a breakdown voltage less than that of the first gas up to the particular distance, and the third gas has a breakdown voltage less than that of the second gas at distances greater than the particular distance. For example, for distances greater than the first distance between the patterning surface 112 of the template 108 and the surface 148 of the substrate 102 and the given pressure of the working environment 172, the third gas is associated with breakdown voltages less than that of the second gas. For distances between the patterning surface 112 of the template 108 and the surface 148 of the substrate 102 greater than the first distance associated with the point 408, the breakdown voltages associated with the third gas is less than the breakdown voltages associated with the second gas.

The invention claimed is:
1. An imprint lithography method comprising:
disposing a polymerizable material on a surface of a substrate;
contacting the polymerizable material with a patterning surface of an imprint lithography template;
curing the polymerizable material in a working environment, comprising a first gas, to yield a cured polymeric layer, the working environment proximate to the surface of the substrate;
introducing a second gas into the working environment;
after introducing the second gas into the working environment, separating the patterning surface of the imprint lithography template and the surface of the substrate to achieve at least a particular distance between the patterning surface of the imprint lithography template and the surface of the substrate; and
after achieving at least the particular distance between the patterning surface of the imprint lithography template and the surface of the substrate, introducing a third gas into the working environment,
wherein, for a given pressure of the working environment, the second gas has a breakdown voltage less than that of the first gas up to the particular distance, and the third gas has a breakdown voltage less than that of the second gas at distances greater than the particular distance.

2. The method of claim 1, wherein introducing the second gas into the working environment comprises displacing the first gas from the working environment.

3. The method of claim 1, wherein introducing the third gas into the working environment comprises displacing at least the second gas from the working environment.

4. The method of claim 1, wherein the first gas and the third gas comprise helium and the second gas comprises air.

5. The method of claim 1, wherein the first gas comprises helium, the second gas comprises air, and the third gas comprises neon and argon.

6. The method of claim 1, further comprising after introducing the third gas into the working environment, introducing a fourth gas into the working environment, wherein, for the given pressure of the working environment, the fourth gas has a breakdown voltage less than that of the third gas at subsequent distances between the patterning surface of the imprint lithography template and the surface of the substrate, the subsequent distances greater than the particular distance.

7. The method of claim 6, wherein introducing the fourth gas into the working environment comprises displacing at least the third gas from the working environment.

8. The method of claim 6, wherein the first gas and the third gas comprise helium, the second gas comprises air, and the fourth gas comprises neon and argon.

9. An imprint lithography method of manufacturing an article, comprising:
   contacting a polymerizable material disposed on a surface of a substrate with a patterning surface of an imprint lithography template;
   curing the polymerizable material in a working environment, comprising a first gas,
   to yield a cured polymeric layer, the working environment proximate to the surface of the substrate;
   introducing a second gas into the working environment;
   after introducing the second gas into the working environment, separating the patterning surface of the imprint lithography template and the surface of the substrate to yield the article and achieve at least a particular distance between the patterning surface of the imprint lithography template and the surface of the substrate; and
   after achieving at least the particular distance between the patterning surface of the imprint lithography template and the surface of the substrate, introducing a third gas into the working environment,
   wherein, for a given pressure of the working environment, the second gas has a breakdown voltage less than that of the first gas up to the particular distance, and the third gas has a breakdown voltage less than that of the second gas at distances greater than the particular distance.

10. The method of manufacturing an article of claim 9, wherein the first gas and the third gas comprise helium and the second gas comprises air.

11. The method of manufacturing an article of claim 9, wherein the first gas comprises helium, the second gas comprises air, and the third gas comprises neon and argon.

12. The method of manufacturing an article of claim 9, further comprising after introducing the third gas into the working environment, introducing a fourth gas into the working environment, wherein, for the given pressure of the working environment, the fourth gas has a breakdown voltage less than that of the third gas at subsequent distances between the patterning surface of the imprint lithography template and the surface of the substrate, the subsequent distances greater than the particular distance.

* * * * *